(12) United States Patent
Wang et al.

(10) Patent No.: US 6,885,037 B1
(45) Date of Patent: Apr. 26, 2005

(54) IC PACKAGE WITH STACKED SHEET METAL SUBSTRATE

(75) Inventors: Bily Wang, Hsin-Chu (TW); Jonnie Chuang, Taipei (TW); Chi-Wen Hung, Chungli (TW)

(73) Assignee: Harvatek Corp., Hsin-Chu (TW)

( * ) Notice: Subject to any disclaimer, the term of this patent is extended or adjusted under 35 U.S.C. 154(b) by 0 days.

(21) Appl. No.: 10/697,610

(22) Filed: Oct. 31, 2003

(51) Int. Cl.[7] .............................................. H01L 33/00
(52) U.S. Cl. ........................... 257/99; 257/91; 257/677
(58) Field of Search .............................. 257/99, 91, 677

(56) References Cited

U.S. PATENT DOCUMENTS 6,770,498 B1 * 8/2004 Hsu ............................. 438/26

* cited by examiner

Primary Examiner—David Nelms
Assistant Examiner—Tu-Tu Ho
(74) Attorney, Agent, or Firm—Rosenberg, Klein & Lee

(57) ABSTRACT

Stacked metal sections serve as two leads of an IC package. In one embodiment, an IC chip is mounted on one section serving as the terminal for the bottom electrode of the chip, and the top electrode of the chip is wire-bonded to the other section serving as another terminal for the chip. The thin sheet metal permits narrower etched separation between the two metal sections. Stacking of two pre-etched thin sheet metals strengthens the substrate. The package is covered with glue to hold the two sections together. The stacked pre-etched metal sheets can serve as a common substrate for a matrix of IC packages, which can later be cut in two orthogonal directions to yield individual packages.

8 Claims, 9 Drawing Sheets

A

B

C

IC PACKAGE WITH STACKED SHEET METAL SUBSTRATE

BACKGROUND OF THE INVENTION (1) Field of the Invention

This invention relates to integrated circuit (IC) packaging.

(2) Brief Description of Related Art

In the IC packaging art, the IC chip size tends to be smaller as time progresses. In cutting such small dimensions, chemical etching now replaces the mechanical sawing, because the damage caused by sawing propagates toward the IC itself.

FIG. 1 shows a prior art substrate 10 for an array of IC packages. Each package or block, as shown within the dot-dash line boundary, has two metal plates 11 and 12 serving as terminals for an IC chip 15, which is mounted on the metal plate 11. The bottom electrode of the IC chip 15 is coupled to the metal plate 11, and the top electrode of the IC chip 15 is wire-bonded by wire 16 to the metal plate 12. All the metal terminals are originally from a common metal substrate, but are etched through by chemical etching along the orthogonal grooves 14. The grooves are separated by narrow necks 13 to hold the metal in one piece. The necks 13 are later broken off to yield individual blocks.

The width W of the etched groove 14 should be as narrow as possible to increase the packing density of the packages per IC wafer. However, during chemical etching of the grooves 14, the minimum width W is proportional to the thickness of the metal substrate as shown in FIG. 2. In the upper section (A), the metal substrate 11, 12 is thin with thickness of T1 and the minimum separation of the groove is W1, because the etching solution etches both horizontally and vertically. If the metal substrate 11, 12 is thicker with a thickness of T2 as shown in section (B), then the minimum width of the groove W2 must necessarily be wider than W1. Thus, the prior art narrow groove is not compatible with thick metal substrate.

Hence, if the substrate on which the IC chip is mounted is too thin, the substrate is too fragile and tends to break. If the substrate is thick, the chemical etching widens the etched separation between adjacent blocks, as well as the separation W between leads on the same block, and lowers the packing density.

SUMMARY OF THE INVENTION

An object of this invention is to decrease the separation between leads within an IC package. Another object of this invention is to increase the packing density of IC chips. A further object of this invention is to prevent breakage of IC during fabrication.

These objects are achieved by stacking two thin sheet metals as substrate. The chemical etch line of each thin metal sheet can be made very narrow to increase packing density. Stacking of the metal sheets strengthen the substrate.

BRIEF DESCRIPTION OF THE DRAWINGS

FIG. 4 shows the stacked sheet metal substrate with through holes for sealing glue to sink in.

FIG. 5 shows a second version of metal substrate with through holes for sealing glue to sink in.

DETAILED DESCRIPTION OF THE INVENTION

Figure 1:
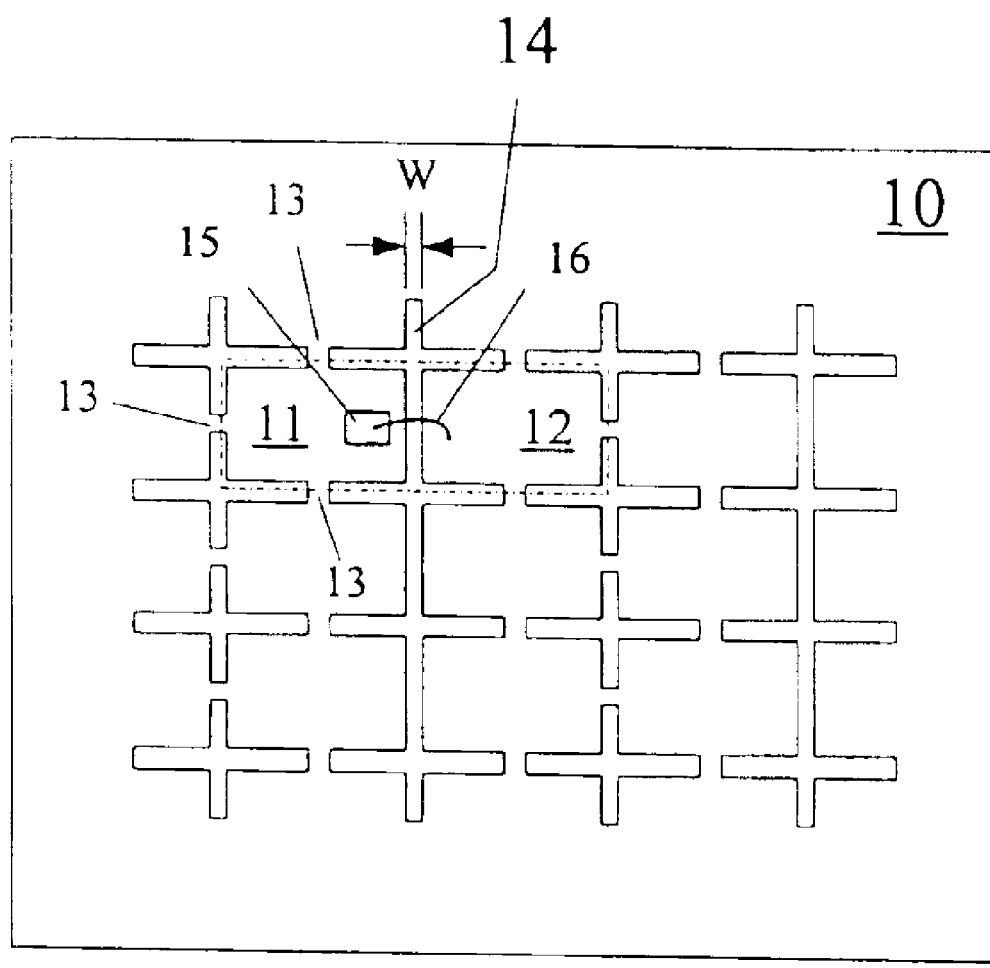
FIG. 1 shows the etched grooves on an IC wafer before cutting in prior art.
Figure 2:
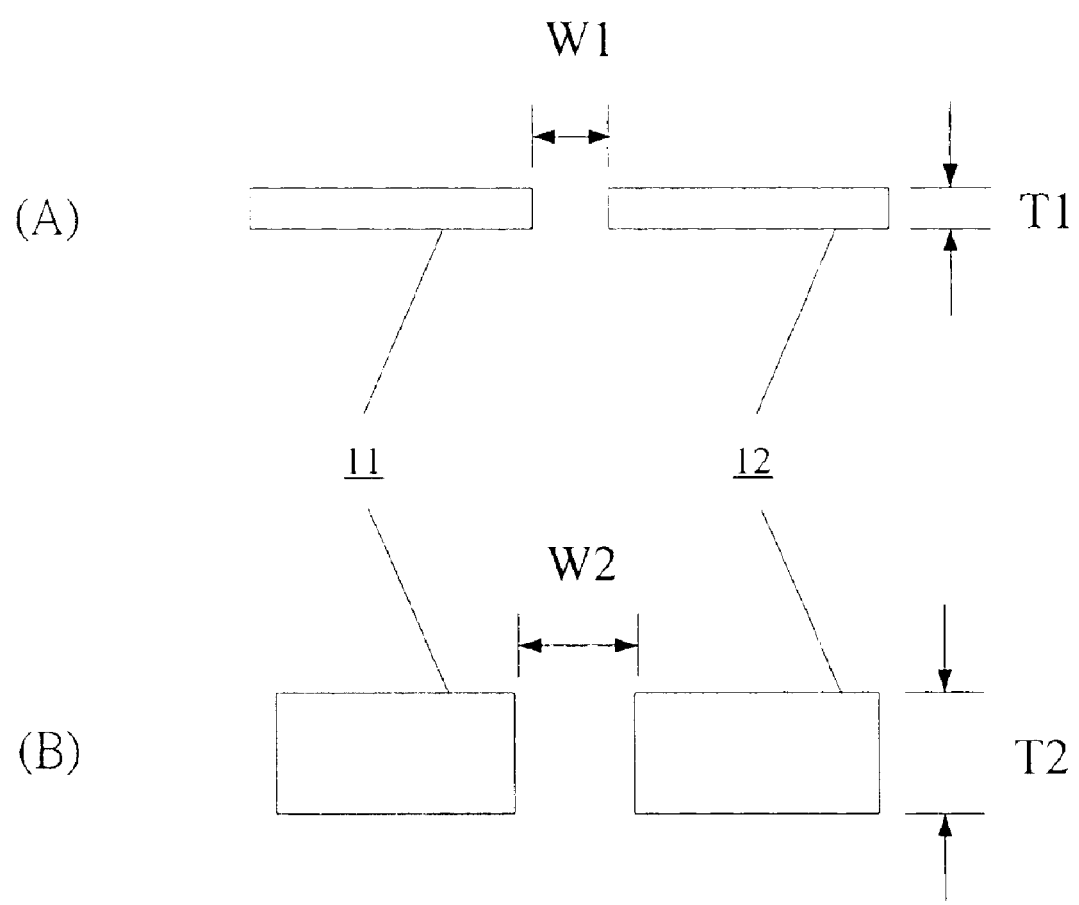
FIG. 2 shows the difference in the widths of etched grooves for (A) a thin substrate, and (B) a thick substrate.

The principle of the present invention is to stack two pre-etched thin metal sheets as shown in FIG. 1 to form the stacked substrate. In each thin metal sheet, the separation between the two metal leads can be made narrow as shown in FIG. 2. By stacking two pre-etched metal sheets, the substrate is reinforced and no longer fragile.

Figure 3:
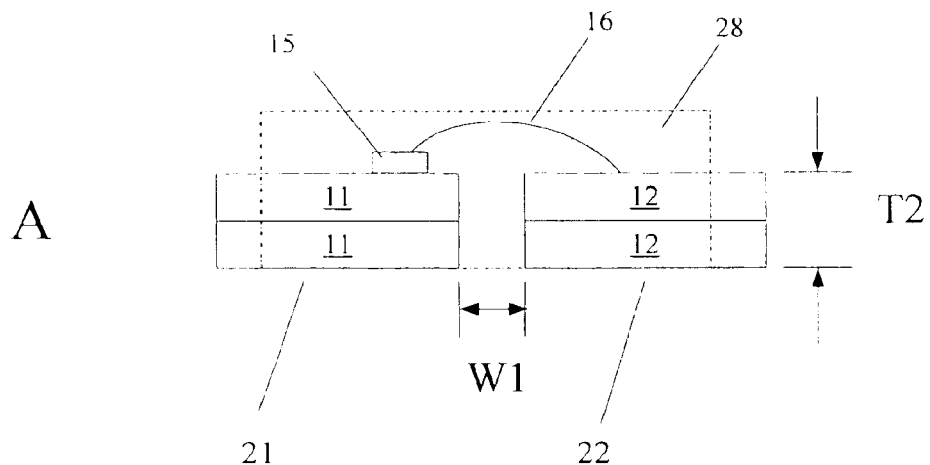
FIG. 3 shows the basic stacked sheet metal substrate of the present invention for: (A) single-sided interconnection, (B) double-sided interconnection, and (C) another version of double-sided interconnection.
Figure 3:
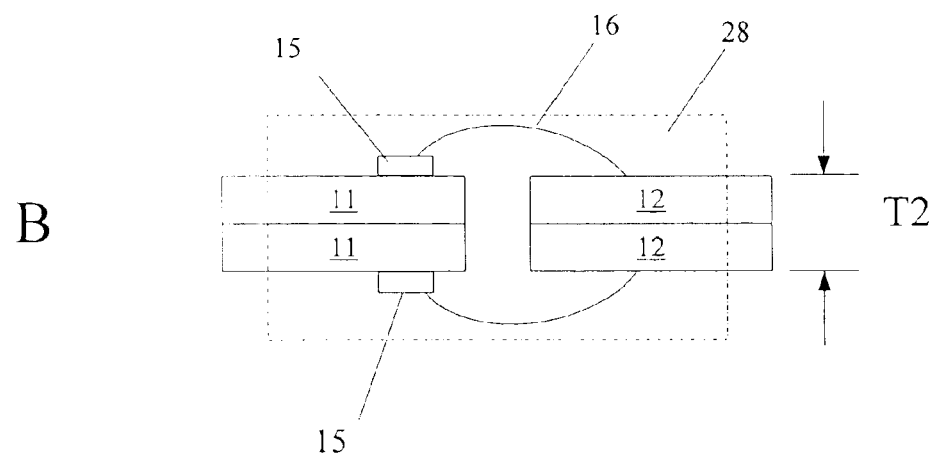
Figure 3:
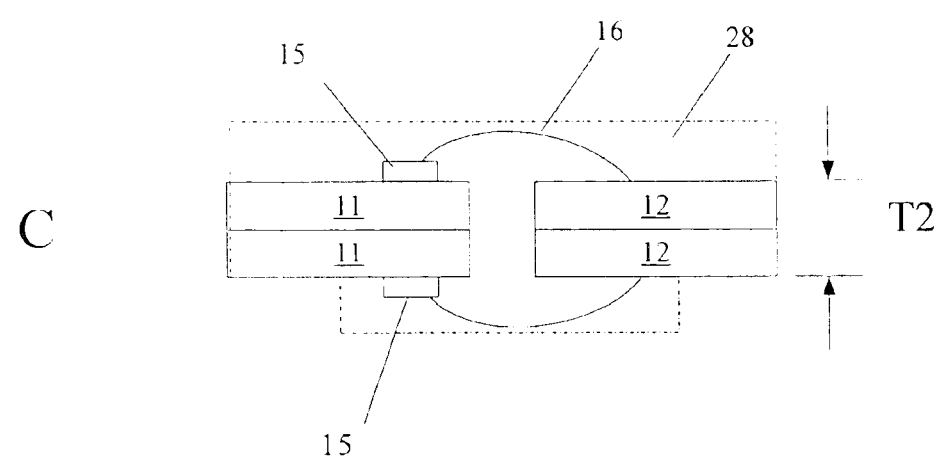

FIG. 3 shows the structures of the present invention In section A, two thin metal sheets 11, 12 are stacked to form strong leads 21 and 22 for the IC chip 15. Each thin metal sheet 11 is separated from metal sheet 12 by a narrow gap W1, but the total thickness of the stack is T2 to give the stacked metal lead sufficient strength. The resultant is a narrower package. The bottom electrode of the electrode IC chip is mounted on the top of the stacked metal 21, and the top electrode of the IC chip is wire-bonded to the top of the stacked metal 22. The package is then sealed in glue 28 to hold the two stacked metal 21, 22 together. The function is similar to that in FIG. 1.

In section B of FIG. 3, the package is for mounting two IC chips 15 on two sides of a stacked metal sheet substrate 11, 12. The lower part of the structure is a mirror of the upper part. Otherwise, the stacked substrate is thick with a thickness T2 and a narrow gap W1. The reference numerals correspond to same parts in section A In section C of FIG. 3 is similar to section B except that the sealing glue 28 covering the upper substrate is not symmetrical to that covering the lower substrate.

Figure 4:
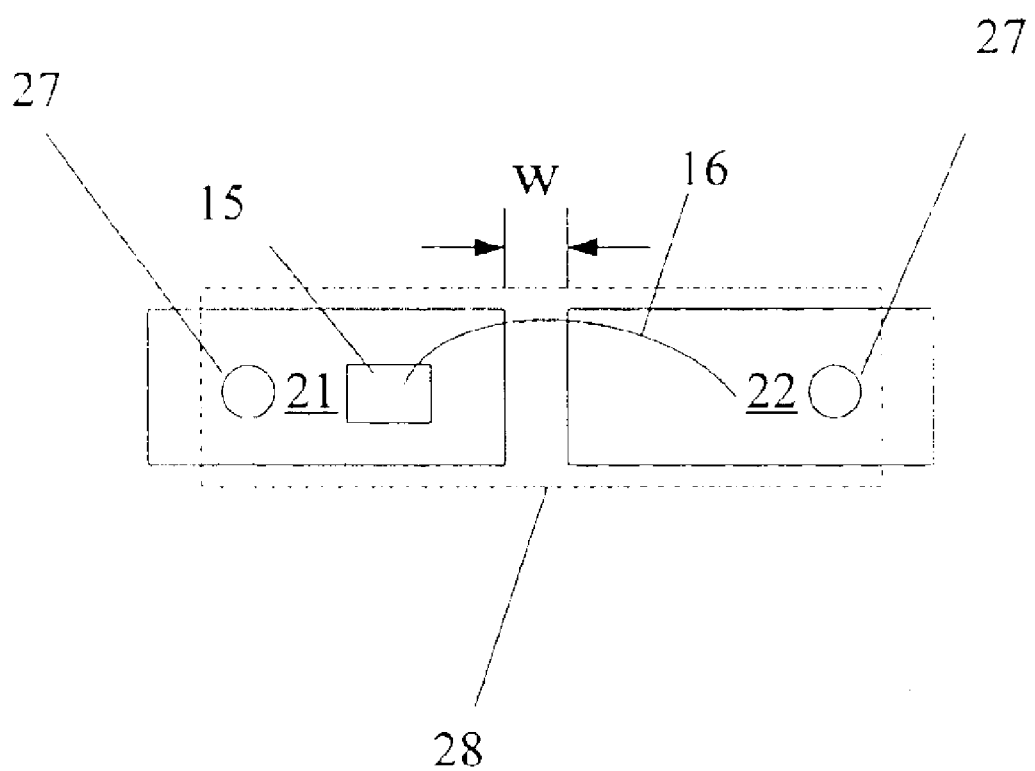

FIG. 4 shows fourth embodiment of the invention. The figure shows the top horizontal surface of a stacked metal substrate package similar to that in FIG. 3. In addition, through holes 27 are placed in each of the stacked metal plates 21, 22. The through-hole allows the sealing glue 28 to sink in to make the package stronger. The glue 28 also overhangs over the vertical side walls of the stacked substrate to strengthen the hold of the stacked structure. The gap between stacked metal plates is narrow with width W. The IC chip 15 and the bonding wire 16 correspond to the similar parts in FIG. 3.

Figure 5:
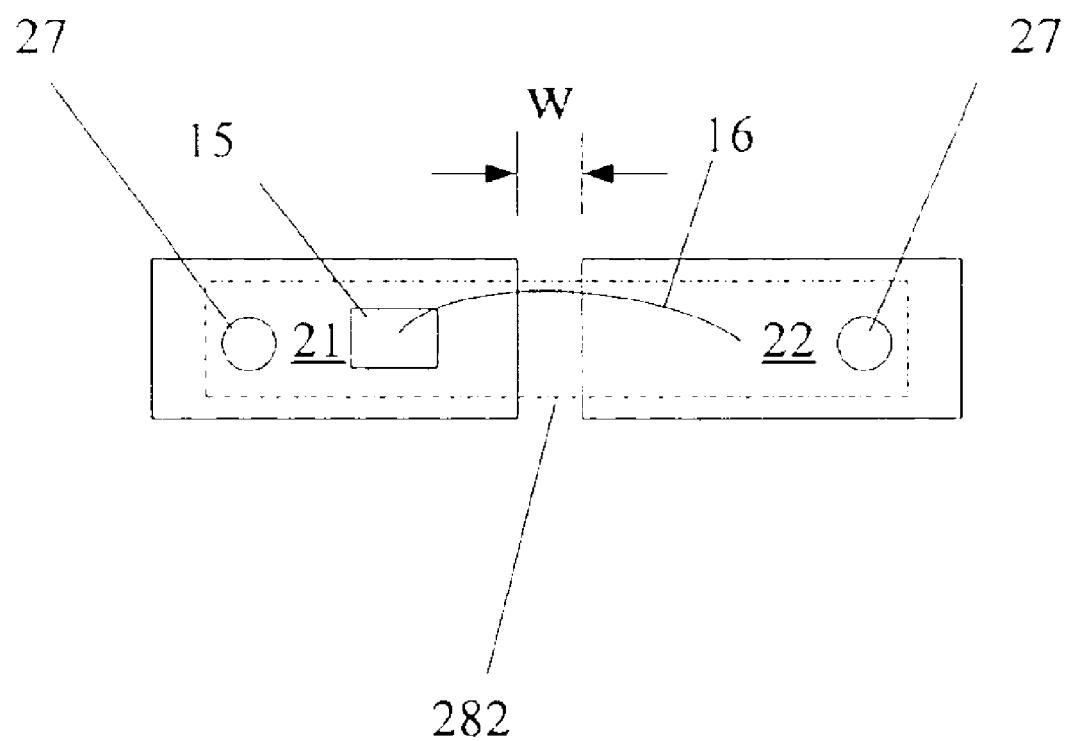

FIG. 5 shows a fifth embodiment of the invention The structure is similar to that in FIG. 4, except that the glue covers a narrower width of the substrate and does not overhang over the sides of the stacked substrate. The package is narrower than that in FIG. 4. The reference numerals correspond to similar parts in FIG. 4.

Figure 6:
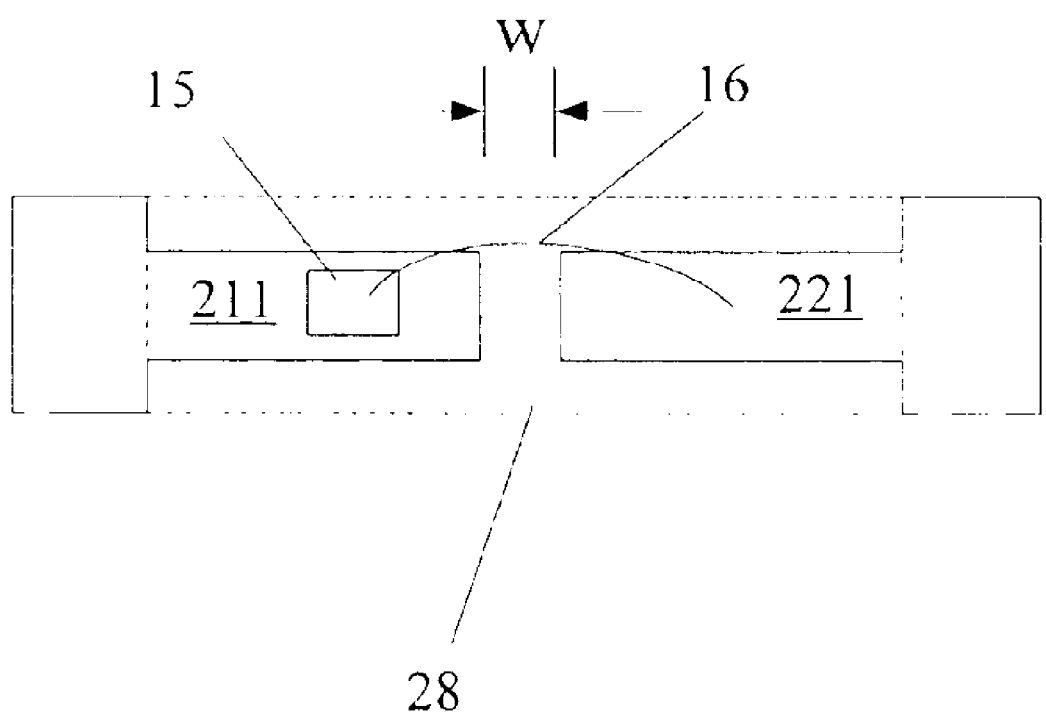
FIG. 6 shows the stacked sheet metal substrate with extended metal leads.

FIG. 6 shows a sixth embodiment of the present invention. The structure is similar to that in FIG. 4, except that stacked metal substrate 211, 221 is recessed in the mid section where the sealing glue 28 covers. By recessing the substrate, the sealing glue does not protrude outside the maximum width of the stacked metal substrate 211, 221. Yet, the glue covers the sides of the stacked metal to strengthen the structure. The IC chip 15, bonding wire 16 and the gap 16 correspond to that in FIG. 4.

Figure 7:
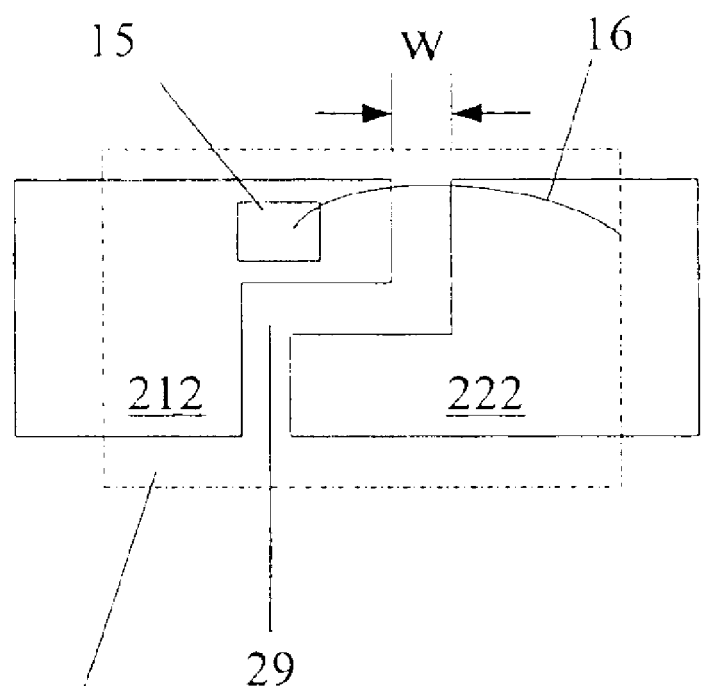
FIG. 7 shows the stacked sheet metal substrate with zigzag extended metal leads.

FIG. 7 shows a seventh embodiment of the present invention. The metal leads 212, 222 are made zigzag along the adjacent borders to increase the hold of the glue.

Figure 8:
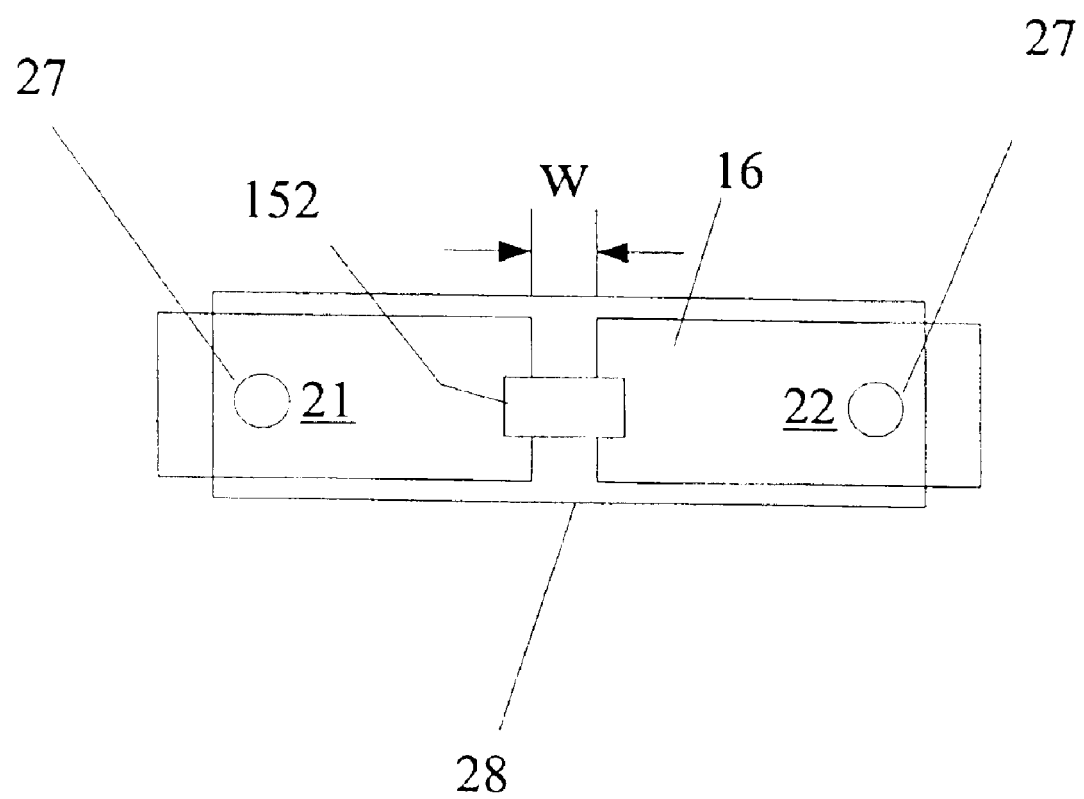
FIG. 8 shows a diode flip chip mounting on the two metal leads.

FIG. 8 shows an eighth embodiment of the present invention. The structure is similar to FIG. 4 except that the chip 152 straddles over the two metal stacks 21, 22 with flip-chip technology.

Figure 9:
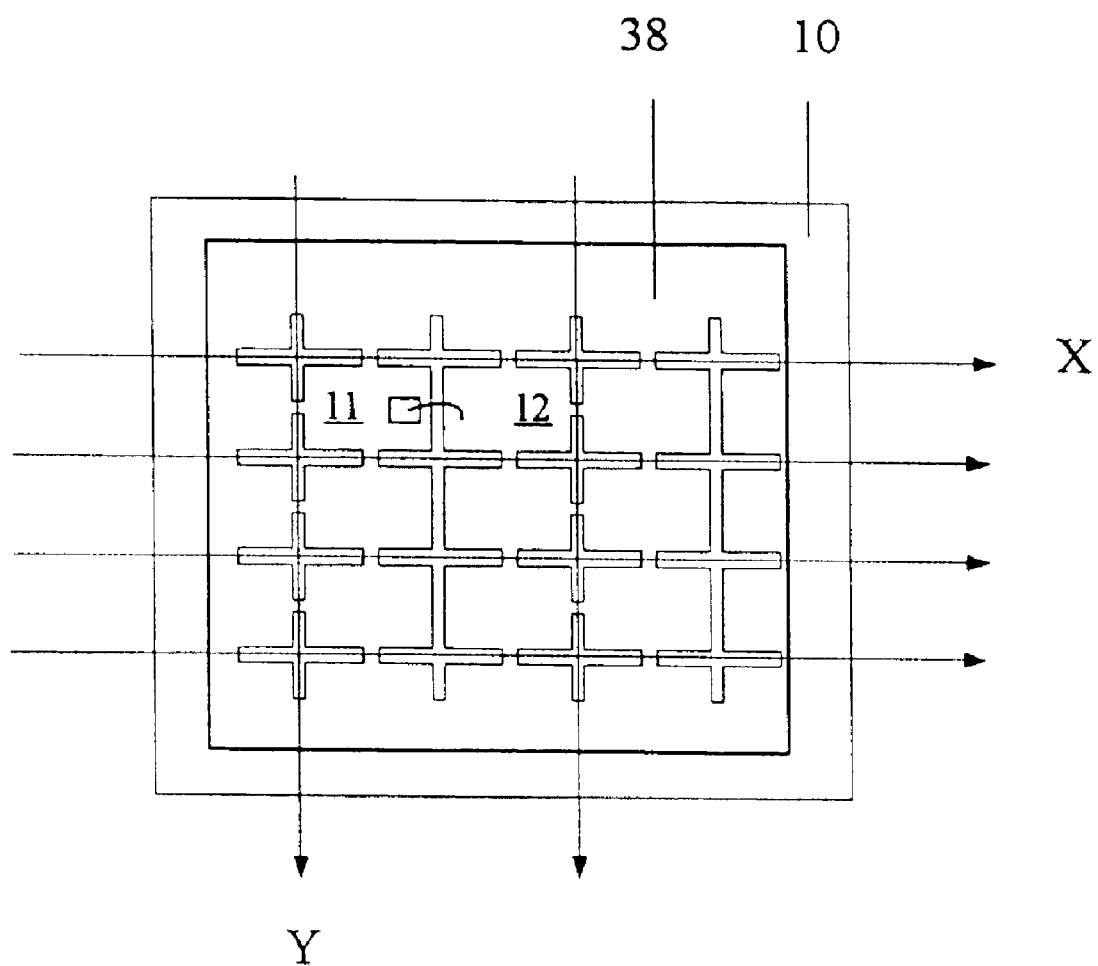
FIG. 9 shows the method for batch processing the IC chips.

FIG. 9 shows a method for batch processing the IC chips for mass production. A matrix of IC blocks are fabricated on the common stacked substrate 10 by sequentially pre-etching the metal substrate, mounting an IC chip on lead 11, wire-bonding to lead 12, stacking at least two sheets of pre-etched metal substrates, and glue sealing the structure as described in foregoing embodiments. Each IC block is bounded by the horizontal X lines and the vertical Y lines. The common stacked substrate is then cut along the X lines and Y lines to yield individual packages. Alternatively, the fabrication process may use a sequence of pre-etching the metal substrate, stacking at least two sheets of pre-etched metal substrates, mounting an IC chip on lead 11, wire-bonding to lead 12, glue sealing the structure as described in foregoing embodiments, and cutting along X-lines and Y-lines to form individual packages.

While the preferred embodiment of the invention have been described, it will be apparent to those skilled in the art that various modifications may be made without departing from the spirit of the present invention. Such modifications are all within the scope of this invention.

What is claimed is:

1. An integrated circuit (IC) package, comprising:
   a fist section and a second section of a common stacked metal substrate with an upper layer and a lower layer;
   an IC chip having two electrodes each coupled to one of the two sections respectively; and
   a glue to hold said first section and said second section together, leaving the far ends of said first section and said second section uncovered, said far ends serving as terminals for the IC package.

2. The IC package as described in claim 1, further comprising a second IC diode chip mounted at the bottom of said lower layer and connected in parallel with the IC diode chip mounted on the upper layer of said first section.

3. The IC package as described in claim 1, further comprising a through hole in each of said first section and said section for said glue to fill, thereby strengthening the hold of the glue to hold said first section and said second section.

4. The IC package as described in claim 1, wherein said first section and said second section of said package are recessed, so that the glue covers only the recesses of the recessed section.

5. The IC package as described in claim 1, wherein the gap between said first section and said second section is zigzag to increase the hold of the glue.

6. The IC package as described in claim 1, wherein the coupling is wire-bonding.

7. The IC package as described in claim 1, wherein the coupling is flip-chip technology.

8. The IC package as described in claim 1, further comprising a matrix of said IC package mounted first on said common stacked metal substrate, and then cut apart in two orthogonal directions to yield individual packages.

* * * * *